US006852470B1

(12) United States Patent
Kita et al.

(10) Patent No.: US 6,852,470 B1
(45) Date of Patent: Feb. 8, 2005

(54) HEAT-SENSITIVE LITHOGRAPHIC PRINTING PLATE PRECURSOR

(75) Inventors: Nobuyuki Kita, Shizuoka (JP); Keiji Akiyama, Shizuoka (JP); Hidekazu Oohashi, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 09/662,548

(22) Filed: Sep. 15, 2000

(30) Foreign Application Priority Data

Sep. 17, 1999 (JP) ....................................... P. 11-264379

(51) Int. Cl.$^{7}$ .................................................. G03F 7/11

(52) U.S. Cl. ............................... 430/273.1; 430/271.1; 430/964

(58) Field of Search ........................... 430/270.1, 281.1, 430/286.1, 287.1, 964, 271.1, 273.1

(56) References Cited

U.S. PATENT DOCUMENTS

| | | | | | |
|---|---|---|---|---|---|
| 5,445,912 | A | * | 8/1995 | Hauquier et al. | 430/159 |
| 5,462,833 | A | * | 10/1995 | Hauquier et al. | 430/159 |
| 5,939,237 | A | * | 8/1999 | Gardner, Jr. et al. | 430/273.1 |
| 5,985,515 | A | * | 11/1999 | Van Rompuy et al. | 430/272.1 |
| 6,014,929 | A | * | 1/2000 | Teng | 101/456 |
| 6,045,969 | A | * | 4/2000 | Verschueren et al. | 430/270.1 |
| 6,138,568 | A | * | 10/2000 | McCullough et al. | 101/465 |
| 6,197,478 | B1 | * | 3/2001 | Vermeersch et al. | 430/272.1 |
| 6,210,857 | B1 | * | 4/2001 | Vermeersch et al. | 430/270.1 |
| 6,238,838 | B1 | * | 5/2001 | Gaschler et al. | 430/278.1 |
| 6,383,692 | B1 | * | 5/2002 | Leenders et al. | 430/5 |
| 6,387,595 | B1 | * | 5/2002 | Teng | 430/302 |
| 2001/0024766 | A1 | * | 9/2001 | Kita et al. | 430/272.1 |
| 2001/0033992 | A1 | * | 10/2001 | Kita | 430/273.1 |

FOREIGN PATENT DOCUMENTS

| | | | |
|---|---|---|---|
| EP | 0 580 393 | A2 | 1/1994 |
| EP | 0 787 583 | A2 | 8/1997 |
| EP | 0 967 077 | A | 12/1999 |
| WO | 94 18005 | A | 8/1994 |

* cited by examiner

*Primary Examiner*—Barbara L. Gilliam
(74) *Attorney, Agent, or Firm*—Burns, Doane, Swecker & Mathis, L.L.P.

(57) ABSTRACT

A heat-sensitive lithographic printing plate precursor comprising a substrate having ink-receptive surface or coated with an ink-receptive layer having provided thereon a hydrophilic layer which comprises:

(1) a colloid of an oxide or a hydroxide of at least one element selected from the group consisting of beryllium, magnesium, aluminum, silicon, titanium, boron, germanium, tin, zirconium, iron, vanadium, antimony, and transition metals, (2) a hydrophilic resin, and (3) a light-to-heat conversion material.

9 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor which requires no development processing and is excellent in press life and resistance to staining. More specifically, the present invention relates to a lithographic printing plate precursor capable of image-recording by an infrared ray or near infrared ray laser beam scanning exposure based on digital signals, and a lithographic printing plate precursor on which the image has been recorded can be directly loaded on a printer (i.e., a printing press) without undergoing development processing and then printing can be effected.

BACKGROUND OF THE INVENTION

Various techniques have been suggested as to the lithographic printing plate precursor capable of image-forming by heat and directly loadable on a printer without undergoing development processing. One promising method is a method of utilizing abrasion, wherein a lithographic printing plate precursor is subjected to exposure with solid state high output infrared-ray lasers such as a semiconductor laser or a YAG laser to make the irradiated part generate heat with a light-to-heat conversion material, thereby cracking evaporation is caused.

That is, this is a method of providing a hydrophilic layer on a lipophilic substrate or a substrate having a lipophilic layer and removing the hydrophilic layer by abrasion.

WO 94/18005 discloses a printing plate comprising a laser beam-absorbing lipophilic layer having provided thereon a crosslinked hydrophilic layer, wherein the hydrophilic layer is removed by abrasion. This hydrophilic layer comprises polyvinyl alcohol crosslinked with the hydrolyzate of tetraethoxysilane and titanium dioxide particles contained therein, which intends to improve the strength of the hydrophilic layer. The impression capability of a lithographic printing plate precursor is improved by this technique, however, since the polyvinyl alcohol having hydrocarbon groups and not always having high hydrophilic property accounts for 48 wt % of the hydrophilic layer, the resistance to staining is not still sufficient and further improvement is required.

There are disclosed in WO 98/40212, WO 99/19143 and WO 99/19144 lithographic printing plate precursors directly loadable on a printer without subjecting to development, which comprises a substrate having coated thereon an ink-receptive layer, and a hydrophilic layer comprising, as a main component, a colloid such as silica, crosslinked with a crosslinking agent such as aminopropyltriethoxysilane. This hydrophilic layer contains hydrocarbon groups as small as possible to heighten the resistance to printing staining and is improved in the impression capability by crosslinking the colloid with a crosslinking agent, but the impression capability is several thousands, which is still insufficient.

The digital direct processing-free printing plate which utilizes abrasion has big advantages of rationalization of printing and the reduction of wastes such that plate-making can be performed directly from a camera-ready copy without the use of a film, the printing plate can be loaded on a printer as it is and printing can be performed immediately. However, due to the difficulty of processing-free technique, either the resistance to staining or the impression capability, both of which are fundamentals of the printing, is liable to be damaged, therefore, a technique which makes both compatible has not yet been developed.

SUMMARY OF THE INVENTION

An object of the present invention is to solve the above problem. That is, an object of the present invention is to provide a heat-sensitive lithographic printing plate precursor that can be directly mounted on a printer (i.e., a printing press) without development processing and printing can be performed immediately, is excellent in press life and resistance to printing staining.

The present inventors have found that, by the development of a novel and superior hydrophilic layer, a heat-sensitive lithographic printing plate precursor which can be directly mounted on a printer without development processing, and is excellent in printing aptitude, in particular, impression capability and resistance to printing staining, can be obtained, thus the present invention has been achieved.

That is, the present invention is as follows.

1. A heat-sensitive lithographic printing plate precursor comprising a substrate having ink-receptive surface or coated with an ink-receptive layer having provided thereon a hydrophilic layer which comprises:

(1) a colloid of an oxide or a hydroxide of at least one element selected from the group consisting of beryllium, magnesium, aluminum, silicon, titanium, boron, germanium, tin, zirconium, iron, vanadium, antimony, and transition metals, (2) a hydrophilic resin, and (3) a light-to-heat conversion material.

2. The heat-sensitive lithographic printing plate precursor according to the above item 1, wherein the proportion of the hydrophilic resin is from 0.1 to 30 wt % of the solid content in the hydrophilic layer.

3. The heat-sensitive lithographic printing plate precursor according to the above item 1, wherein the hydrophilic resin is a high molecular compound having a hydroxyl group or a carboxyl group.

4. The heat-sensitive lithographic printing plate precursor according to the above item 1, wherein the hydrophilic resin is a homopolymer or a copolymer of hydroxyalkyl acrylate or hydroxyalkyl methacrylate.

5. The heat-sensitive lithographic printing plate precursor according to the above item 1, wherein the colloid is a sol comprising a hydrolysis and condensation product of at least one compound selected from the group consisting of tri- and/or tetraalkoxysilane, tetraalkoxy aluminum, tetraalkoxy titanium and tetraalkoxy zirconium.

DETAILED DESCRIPTION OF THE INVENTION

The present invention will be described in detail below.

The hydrophilic layer for use in the present invention comprises a colloid of an oxide or a hydroxide of at least one element selected from the group consisting of beryllium, magnesium, aluminum, silicon, titanium, boron, germanium, tin, zirconium, iron, vanadium, antimony and transition metals, a hydrophilic resin, and a light-to-heat conversion material. The hydrophilic layer according to the present invention is a layer insoluble in a fountain solution in lithographic printing using a fountain solution.

These colloids are produced by various methods such as hydrolysis of the halides and the alkoxy compounds of the above elements and condensation of the hydroxides of the above elements. The above elements form network structure through oxygen atoms and at the same time have non-bonded hydroxyl groups and alkoxy groups and they form mixed structure. Many active alkoxy groups and hydroxyl groups are contained in the initial stage of hydrolysis and condensation and particle diameters become large and active groups become inactive as the reaction progress. The particle size of the colloid is in general from 2 to 500 nm, and in the case of silica, spherical particles having a particle diameter of from 5 to 100 nm are preferably used in the present invention. Pearl neck-like colloids in which spherical particles having particle diameters of from 10 to 50 nm lie in a row in a length of from 50 to 400 nm can also be used.

Further, plume-like colloids of 100 nm×10 nm such as aluminum colloids are also effectively used.

As the hydrophilic resins for use in the hydrophilic layer according to the present invention, resins having a hydrophilic group, such as hydroxyl, carboxyl, hydroxyethyl, hydroxypropyl, amino, aminoethyl, aminopropyl, and carboxymethyl are preferred.

Specific examples of hydrophilic resins include gum arabic, casein, gelatin, starch derivatives, carboxymethyl cellulose, and Na salts thereof, cellulose acetate, sodium alginate, vinyl acetate-maleic acid copolymers, styrene-maleic acid copolymers, polyacrylic acid and salts thereof, polymethacrylic acid and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycol, polypropylene glycol, polyvinyl alcohol, hydrolyzed polyvinyl acetate having a hydrolysis degree of at least 60 wt %, preferably at least 80 wt %, polyvinyl formal, polyvinyl butyral, polyvinyl pyrrolidone, homopolymers and copolymers of acrylamide, homopolymers and copolymers of methacrylamide, and homopolymers and copolymers of N-methylolacrylamide.

Particularly preferred hydrophilic resins are hydroxyl group-containing polymers, specifically homopolymers and copolymers of hydroxyethyl acrylate and hydroxyethyl methacrylate.

The proportion of the addition amount of these hydrophilic resins is preferably from 0.1 to 30 wt %, particularly preferably from 5 to 20 wt %, based on the entire solid content of the hydrophilic layer. When the addition amount is less than this range, impression capability is insufficient, and when it exceeds this range, printing staining is liable to occur.

As the light-to-heat conversion materials to be added to the hydrophilic layer according to the present invention for increasing heat sensitivity, substances which absorb light of the wavelength of 700 nm or more may be used and various pigments and dyes can be used as the light-to-heat conversion materials. As such pigments, commercially available pigments and pigments described in *Color Index* (*C.I.*) *Binran* (*Color Index* (*C.I.*) *Handbook*), *Shaishin Ganryo Binran* (*The Latest Pigment Handbook*), compiled by Nihon Ganryo Gijutsu Kyokai (1977), *Shaishin Ganryo Cyo Gijutsu* (*The Latest Pigment Applied Technique*), published by CMC Publishing Co. Ltd. (1986), *Insatsu Ink Gijutsu* (*Printing Ink Technique*), CMC Publishing Co. Ltd. (1984) can be used.

Various kinds of pigments can be used, e.g., black pigments, brown pigments, red pigments, purple pigments, blue pigments, green pigments, fluorescent pigments, metallic powder pigments, and polymer-attaching pigments can be exemplified. Specifically, insoluble azo pigments, azo lake pigments, condensation azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments, and carbon black can be used.

These pigments may be used without surface treatment or may be surface-treated. As methods of surface treatments, a method of surface-coating with hydrophilic resins and lipophilic resins, a method of adhering surfactants, and a method of attaching reactive substances (e.g., silica sol, alumina sol, silane coupling agents, epoxy compounds, isocyanate compounds, etc.) on the surfaces of pigments can be exemplified. These surface treatment methods are described in *Kinzoku Sekken no Seishitsu to Oyo* (*Natures and Applications of Metal Soaps*), Saiwai Shobo Co., Ltd., *Insatsu Ink Giiutsu* (*Printing Ink Technique*), CMC Publishing Co., Ltd. (1984), and *Shaishin Ganryo Oyo Gijutsu* (*The Latest Pigment Applied Technique*), CMC Publishing Co., Ltd. (1986). Of these pigments, those which absorb infrared rays or near infrared rays are particularly preferred as they are suitable for use of lasers emitting infrared rays or near infrared rays.

As such pigments which absorb infrared rays and near infrared rays, carbon black, carbon black coated with a hydrophilic resin, and carbon black modified with a silica sol are preferably used. Of these, carbon blacks surface-coated with a hydrophilic resin or a silica sol are particularly preferred because they are easily dispersible with water-soluble resins and the hydrophilicity is not impaired.

The particle size of pigments is preferably from 0.01 to 1 μm, more preferably from 0.01 to 0.5 μm. Well-known dispersing methods used in the manufacture of inks and toners can be used as dispersing methods of pigments. Examples of dispersing apparatus include an ultrasonic disperser, a sand mill, an attritor, a pearl mill, a super-mill, a ball mill, an impeller, a disperser, a KD mill, a colloid mill, a dynatron, a three-roll mill, a pressure kneader, etc., and details are described in *Shaishin Ganyro Oyo Gijutsu* (*The Latest Pigment Applied Technique*), CMC Publishing Co., Ltd. (1986).

Dyes for use as a light-to-heat conversion material include commercially available dyes and well-known dyes described, for example, in *Senryo Binran* (*Dye Handbook*), compiled by Yuki Gosei Kagaku Kyokai (1970). Specifically, azo dyes, metal complex azo dyes, pyrazolone azo dyes, anthraquinone dyes, phthalocyanine dyes, carbonium dyes, quinoneimine dyes, methine dyes, and cyanine dyes can be used. Of these dyes, those which absorb infrared rays or near infrared rays are particularly preferred as they are suitable for use of lasers emitting infrared rays or near infrared rays.

As dyes which absorb infrared rays or near infrared rays, e.g., the cyanine dyes disclosed in JP-A-58-125246 (the term "JP-A" as used herein means an "unexamined published Japanese patent application"), JP-A-59-84356, and JP-A-60-78787, the methine dyes disclosed in JP-A-58-173696, JP-A-58-181690, and JP-A-58-194595, the naphthoquinone dyes disclosed in JP-A-58-112793, JP-A-58-224793, JP-A-59-48187, JP-A-59-73996, JP-A-60-52940, and JP-A-60-63744, the squarylium dyes disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, and the dyes disclosed in JP-A-10-268512 can be exemplified.

Further, the near infrared ray-absorbing sensitizing dyes disclosed in U.S. Pat. No. 5,156,938 are also preferably used as the dye. In addition, the substituted arylbenzo(thio) pyrylium salts disclosed in U.S. Pat. No. 3,881,924, the trimethine thiapyrylium salts disclosed in JP-A-57-142645 (corresponding to U.S. Pat. No. 4,327,169), the pyrylium-based compounds disclosed in JP-A-58-181051, JP-A-58-220143, JP-A-59-41363, JP-A-59-84248, JP-A-59-84249, JP-A-59-146063, and JP-A-59-146061, the cyanine dyes disclosed in JP-A-59-216146, the pentamethine thiopyrylium salts disclosed in U.S. Pat. No. 4,283,475, the pyrylium compounds disclosed in JP-B-5-13514 (the term "JP-B" as used herein means an "examined Japanese patent publication") and JP-B-5-19702, Epolight III-178, Epolight III-130, and Epolight III-125 (manufactured by Epolin Co., Ltd.) are particularly preferably used. Of these dyes, specific examples of particularly preferred dyes are shown below in structural formulae.

(I-1)

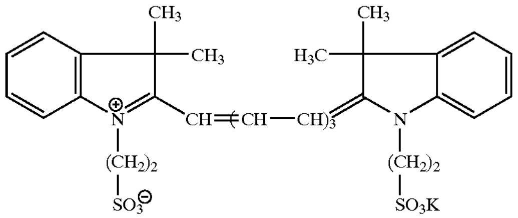

(I-2)

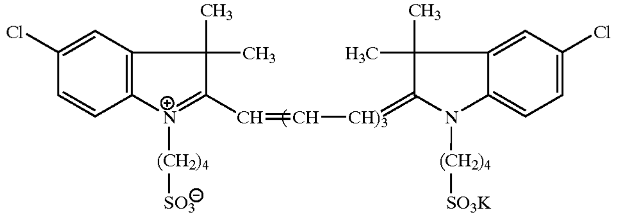

(I-3)

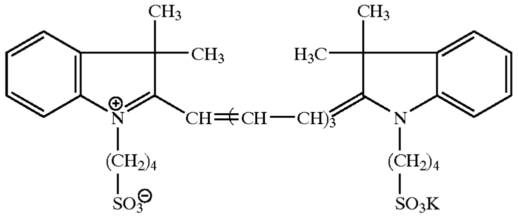

(I-4)

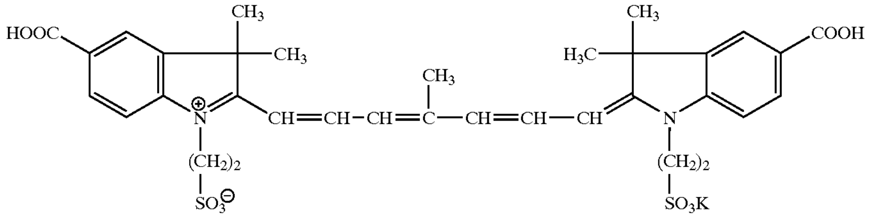

(I-5)

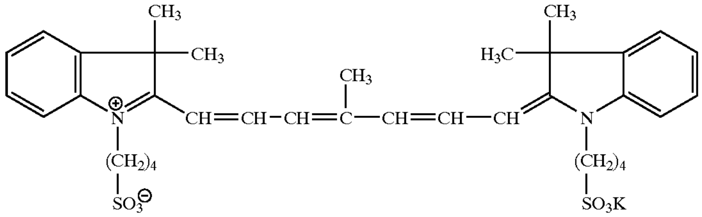

(I-6)

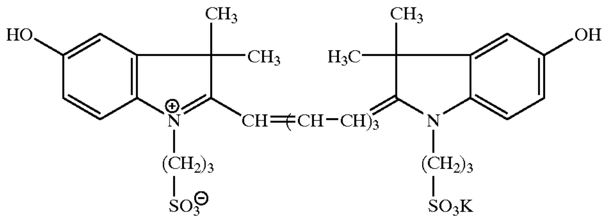

-continued
(I-7)
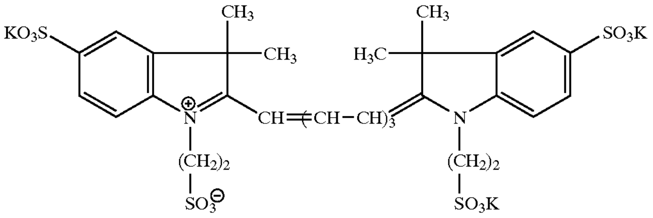
(I-8)
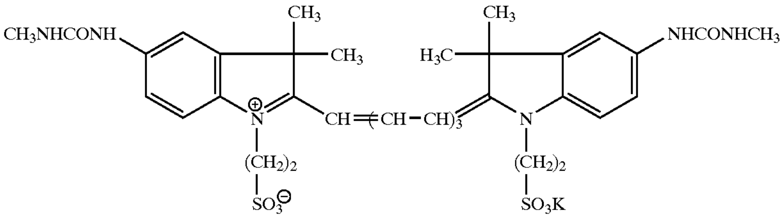
(I-9)
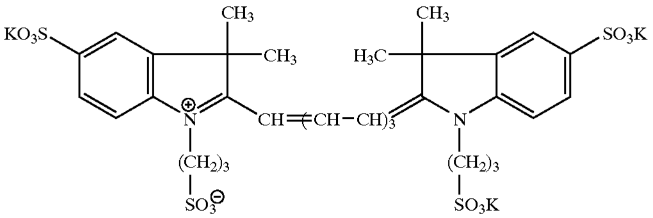
(I-10)
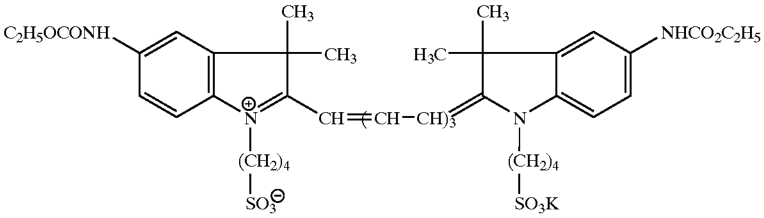
(I-11)
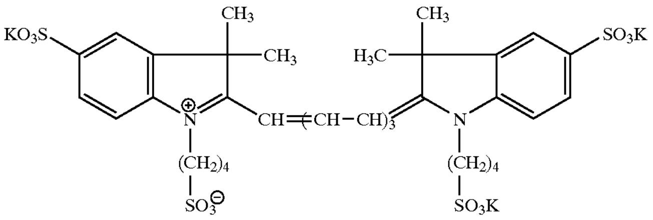
(I-12)
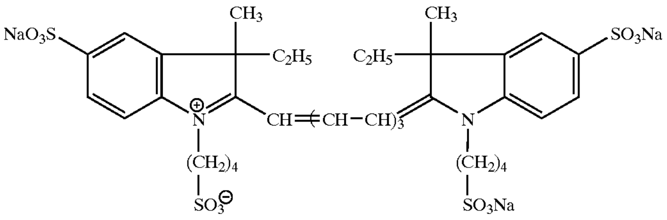
(I-13)
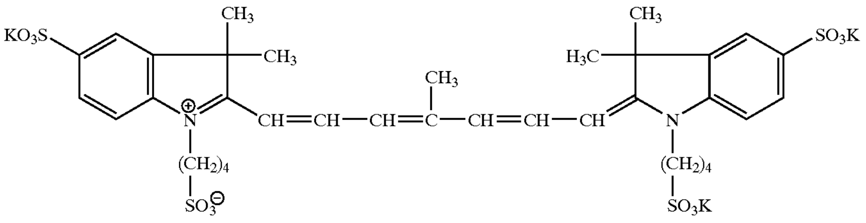

-continued
(I-14)
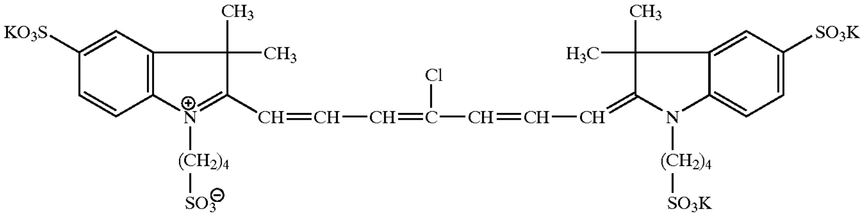
(I-15)
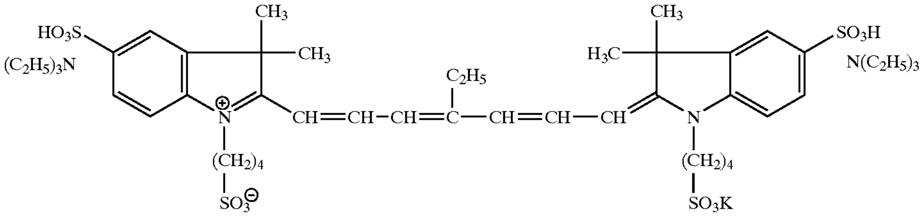
(I-16)
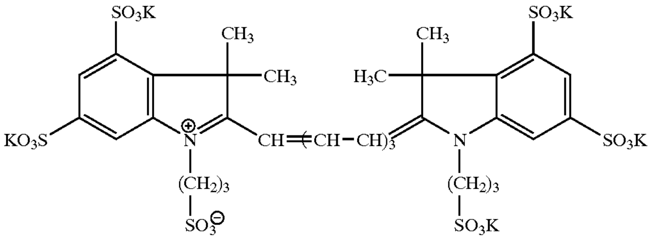
(I-17)
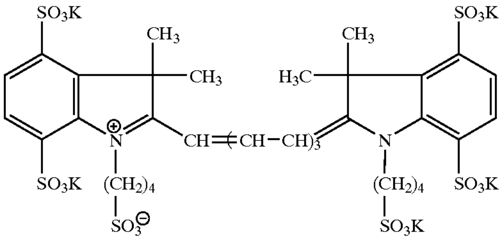
(I-18)
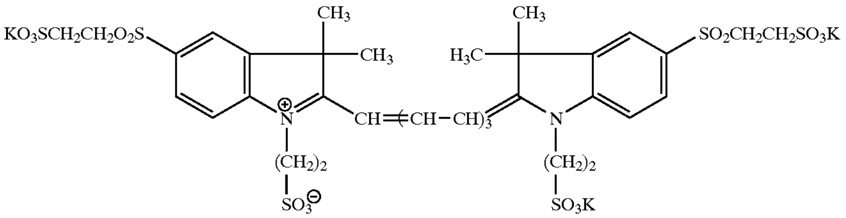
(I-19)
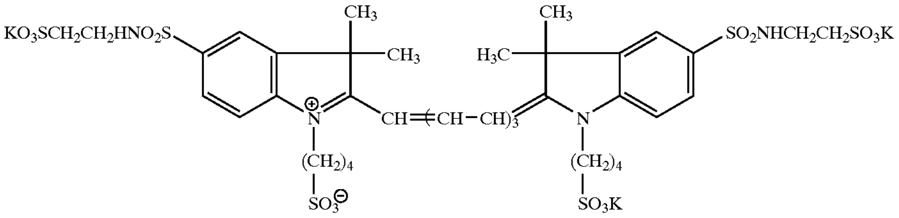

-continued
(I-20)
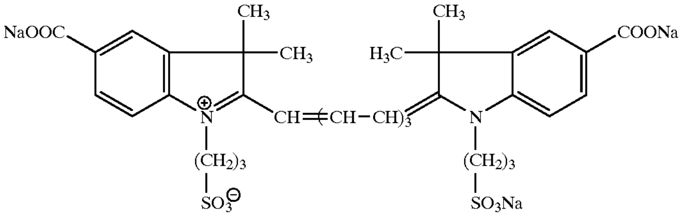
(I-21)
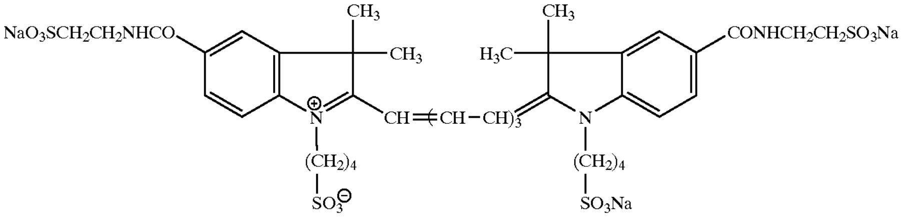
(I-22)
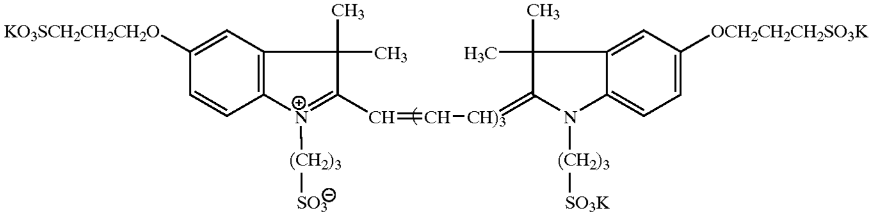
(I-23)
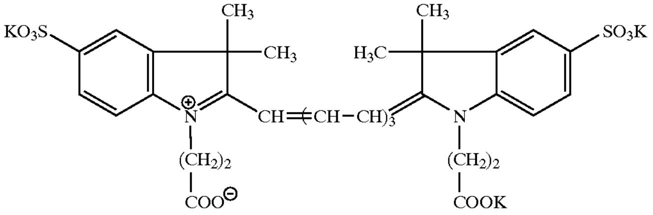
(I-24)
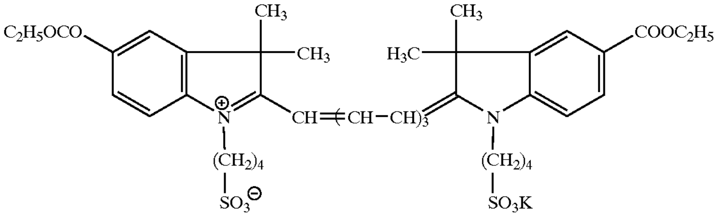
(I-25)
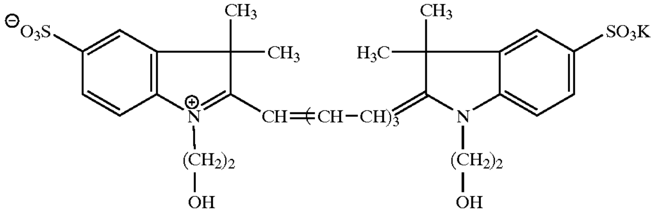
(I-26)
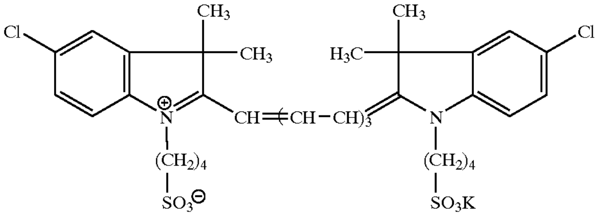

-continued
(I-27)
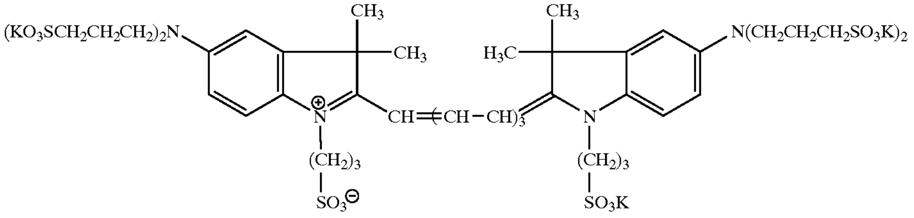
(I-28)
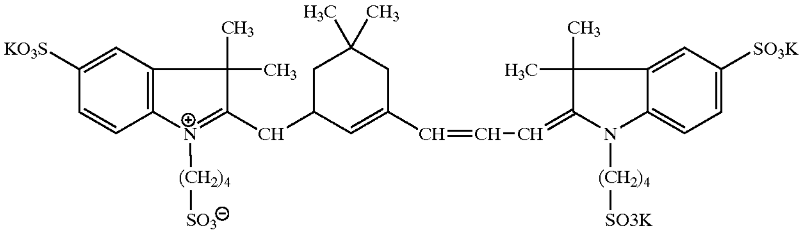
(I-29)
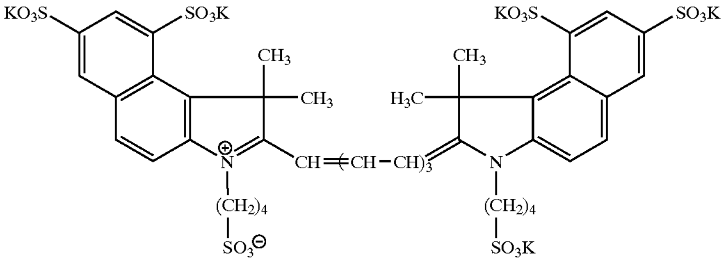
(I-30)
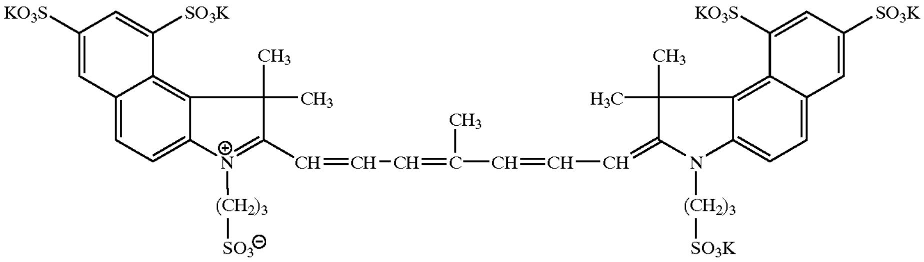
(I-31)
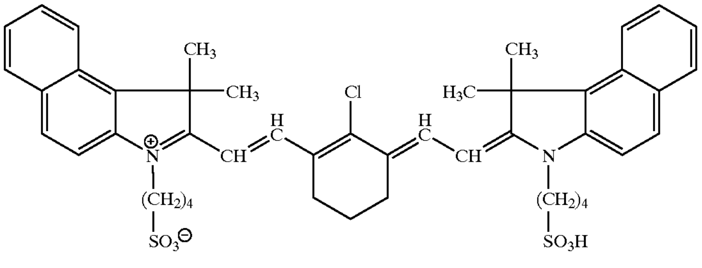
(I-32)
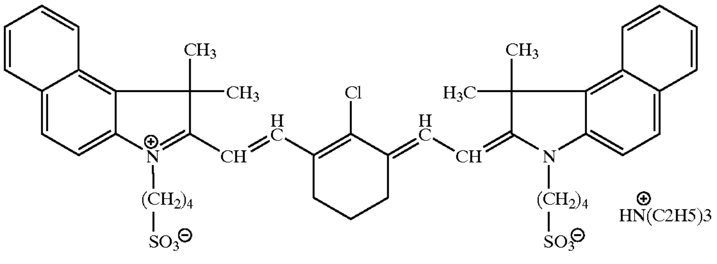

-continued (I-33)

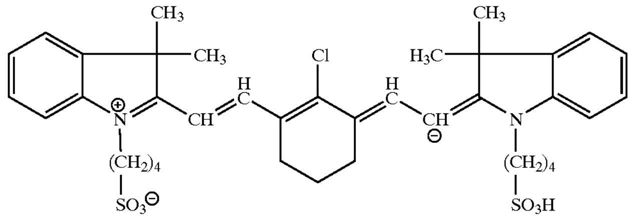

(I-34)

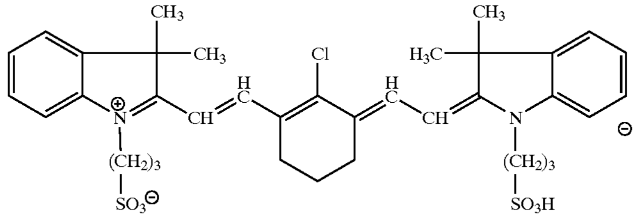

The proportion of the pigment or the dye is from 1 to 50 wt %, preferably from 2 to 20 wt %, of the total weight of the colloid and the hydrophilic resin. When the addition amount of the pigment or the dye is less than the above range, heat sensitivity is lowered, and when the amount exceeds the above range, the hydrophilic property of the layer is impaired or the durability of the layer is deteriorated.

Besides the above-described colloids, hydrophilic resins and light-to-heat conversion materials, a crosslinking agent for accelerating the crosslinking of colloid can be added to the hydrophilic layer of the present invention. An initial hydrolysis condensation product of tetraalkoxysilane, trialkoxysilylpropyl-N,N,N-trialkylammonium halide and aminopropyltrialkoxysilane are preferably used. The addition amount of crosslinking agents is preferably 5 wt % or less of the entire solid content of the hydrophilic layer.

Further, for the purpose of increasing the impression capability at printing, crosslinking agents for hydrophilic resins can be added to the hydrophilic layer according to the present invention. As such crosslinking agents for hydrophilic resins, formaldehyde, glyoxal, polyisocyanate, an initial hydrolysis condensation product of tetraalkoxysilane, dimethylolurea and hexamethylolmelamine can be exemplified.

In addition, well-known fluorine-based surfactants, silicon-based surfactants, polyoxyethylene-based surfactants, etc., may be added to the hydrophilic layer according to the present invention for improving coating surface conditions.

The coating thickness of the hydrophilic layer according to the present invention is preferably from 0.1 to 3 $\mu$m, more preferably from 0.5 to 2 m. When the layer thickness is too thin, the durability of the hydrophilic layer is deteriorated and the impression capability at printing is deteriorated, while when the layer is too thick, a large quantity of energy is required to peel off the hydrophilic layer from the lower ink-receptive layer by abrasion, and long image-drawing time is necessary in laser exposure, as a result, the productivity of producing the printing plate is lowered. When image-drawing is performed with a commercially available general semiconductor laser, a thickness of about 0.5 $\mu$m requires energy of from 300 to 400 mJ/cm$^2$ and a thickness of about 1.5 $\mu$m requires energy of from 400 to 500 mJ/cm$^2$.

Dimensionally stable plate-like substances are used as the substrate having an ink-receptive surface or coated with an ink-receptive layer for use in the present invention, e.g., paper, paper laminated with lipophilic plastics (e.g., polyethylene, polypropylene, polystyrene, etc.), metal plates (e.g., aluminum, zinc, copper, nickel, stainless steel plates, etc.), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), paper or plastic films laminated or deposited with the above metals.

Preferred substrates are polyethylene terephthalate films, polycarbonate films, aluminum or steel plates, and aluminum or steel plates laminated with lipophilic plastic films.

Aluminum plates of conventionally well-known materials can be arbitrarily used in the present invention.

Aluminum plates are preferably subjected to surface roughening treatment before use. By surface roughening treatment, the adhesion of the ink-receptive layer comprising an organic high polymer with the substrate can be ensured. Well-known surface roughening treatments of aluminum plate can be used in the present invention.

The organic high polymers to be coated on the surface of the substrate of the present invention as an ink-receptive layer are those which are soluble in a solvent and capable of forming a lipophilic film. Further, these organic high polymers are preferably insoluble in the coating solvent of the upper hydrophilic layer, but sometimes it is preferred that the organic high polymers are partially swollen in the coating solvent of the upper hydrophilic layer in view of the adhesion with the upper layer. Moreover, when organic high polymers which are soluble in the coating solvent of the upper layer are used, it is preferred to contrive to add a crosslinking agent and so on to harden the polymers in advance.

Examples of useful organic high polymers for use in the present invention include polyester, polyurethane, polyurea, polyimide, polysiloxane, polycarbonate, a phenoxy resin, an epoxy resin, a phenol-formaldehyde resin, an alkylphenol-formaldehyde resin, polyvinyl acetate, an acrylate resin and copolymers thereof, polyvinyl phenol, polyvinyl halogenated phenol, a methacrylate resin and copolymers thereof, an acrylamide copolymer, a methacrylamide copolymer, polyvinyl formal, polyamide, polyvinyl butyral, polystyrene, a cellulose ester resin, polyvinyl chloride and polyvinylidene chloride. Of these organic high polymers, resins having a hydroxyl group, a carboxyl group, a sulfonamido group or a trialkoxysilyl group at the side chain are more preferred because they are excellent in adhesion with the substrate or the upper hydrophilic layer and in some cases they are easily hardened with a crosslinking agent. Besides these, acrylonitrile copolymers, polyurethane, copolymers having a sulfonamido group at the side chain and copolymers having a hydroxyl group at the side chain which are photopolymerized (i.e., photo-hardened) with a diazo resin are preferably used.

In addition, novolak resins and resol resins of condensation with formaldehyde such as phenol, cresol (m-cresol, p-cresol, m/p mixed cresol), phenol/cresol (m-cresol, p-cresol, m/p mixed cresol), phenol-modified xylene, tert-butylphenol, octylphenol, resorcinol, pyrogallol, catechol, chlorophenol (m-Cl, p-Cl), bromophenol (m-Br, p-Br), salicylic acid, and fluoroglucinol, and condensation resins of the above phenol compounds with acetone are useful in the present invention.

As other preferred high polymer compounds, copolymers rn with the monomers shown in (1) to (12) below as repeating units and have molecular weight of generally from 10,000 to 200,000 can be exemplified.

(1) Acrylamides, methacrylamides, acrylates, methacrylates, and hydroxystyrenes, each of which has an aromatic hydroxyl group, e.g., N-(4-hydroxyphenyl)acrylamide, N-(4-hydroxy-phenyl)methacrylamide, o-, m- and p-hydroxystyrene, o-, m- and p-hydroxyphenyl acrylate or methacrylate;

(2) Acrylates and methacrylates each having an aliphatic hydroxyl group, e.g., 2-hydroxyethyl acrylate, or 2-hydroxyethyl methacrylate;

(3) (Substituted) acrylates, e.g., methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate, etc.;

(4) (Substituted) methacrylates, e.g., methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate, etc.;

(5) Acrylamide or methacrylamide, e.g., acrylamide, methacrylamide, N-methylolacrylamide, N-methylolmethacryl-amide, N-ethylacrylamide, N-ethylmethacrylamide, N-hexyl-acrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenyl-methacrylamide, N-benzylacrylamide, N-benzylmethacrylamide, N-nitrophenylacrylamide, N-nitrophenylmethacrylamide, N-ethyl-N-phenylacrylamide, and N-ethyl-N-phenylmethacrylamide, etc.;

(6) vinyl ethers, e.g., ethyl vinyl ether, 2-chloroethyl vinyl ether, hydroxyethyl vinyl ether, propyl vinyl ether, butyl vinyl ether, octyl vinyl ether, phenyl vinyl ether, etc.;

(7) Vinyl esters, e.g., vinyl acetate, vinyl chloroacetate, vinyl butyrate, vinyl benzoate, etc.;

(8) Styrenes, e.g., styrene, methylstyrene, chloromethylstyrene, etc.;

(9) Vinyl ketones, e.g., methyl vinyl ketone, ethyl vinyl ketone, propyl vinyl ketone, phenyl vinyl ketone, etc.;

(10) Olefins, e.g., ethylene, propylene, isobutylene, butadiene, isoprene, etc.;

(11) N-vinylpyrrolidone, N-vinylcarbazole, N-vinylpyridine, acrylonitrile, methacrylonitrile, etc.;

(12) Acrylamides, e.g., N-(o-aminosulfonylphenyl) acrylamide, N-(m-aminosulfonylphenyl) acrylamide, N-(p-aminosulfonyl-phenyl)acrylamide, N-[1-(3-aminosulfonyl)naphthyl]acrylamide, and N-(2-aminosulfonylethyl)acrylamide, methacrylamide, e.g., N-(o-aminosulfonylphenyl)methacrylamide, N-(m-aminosulfonyl-phenyl)methacrylamide, N-(p-aminosulfonylphenyl)methacrylamide, N-[1-(3-aminosulfonyl) naphthyl]methacrylamide, and N-(2-aminosulfonylethyl)methacrylamide, unsaturated sulfonamides such as acrylate, e.g., o-aminosulfonylphenyl acrylate, m-aminosulfonylphenyl acrylate, p-aminosulfonylphenyl acrylate, and 1-(3-aminosulfonylphenylnaphthyl) acrylate, and unsaturated sulfonamides such as methacrylate, e.g., o-aminosulfonylphenyl methacrylate, m-aminosulfonylphenyl methacrylate, p-aminosulfonylphenyl methacrylate, and 1-(3-aminosulfonylphenylnaphthyl) methacrylate, etc.

The ink-receptive layer can be provided by dissolving these organic high polymers in an appropriate solvent and coating them on a substrate and then drying. Organic high polymers may be dissolved in a solvent alone but, if necessary, a crosslinking agent, an auxiliary adhesive (i.e., an adhesion aid), a coloring agent, inorganic or organic fine particles, a coating surface improving agent, or a plasticizer can be added.

In addition, a light-to-heat conversion material for improving heat sensitivity and a heat-color forming compound or a decoloring compound for forming printout images after exposure may be added to the ink-receptive layer.

Specific examples of the crosslinking agents for crosslinking organic high polymers include diazo resins, aromatic azido compounds, epoxy resins, isocyanate compounds, block isocyanate compounds, initial hydrolysis condensation product of tetraalkoxysilane, glyoxal, aldehyde compounds and methylol compounds.

As auxiliary adhesives, the above-described diazo resins are superior in adhesion with the substrate and the hydrophilic layer, in addition, silane coupling agents, isocyanate compounds, titanium coupling agents are also useful.

Ordinarily used dyes and pigments are used as the coloring agents in the present invention, and preferred examples include Rhodamine 6G chloride, Rhodamine B chloride, Crystal Violet, Malachite Green oxalate, oxazine-4-perchlorate, quinizarin, 2-(α-naphthyl)-5-phenyloxazole, and coumarin-4. As other dyes, triphenylmethane-based, diphenylmethane-based, oxazine-based, xanthene-based, iminonaphthoquinone-based, azomethine-based, and anthraquinone-based dyes represented by Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry Co., Ltd.), Victoria Pure Blue, Crystal Violet (C.I. 42555), Methyl Violet (C.I. 42535), Ethyl Violet, Methylene Blue (C.I. 52015), Patent Pure Blue (manufactured by Sumitomo Mikuni Chemical Co., Ltd.), Brilliant Blue, Methyl Green, Erythrisine B, Basic Fuchsine, m-Cresol Purple, Auramine, 4-p-diethylaminophenyliminonaphthoquinone, and cyano-p-diethylaminophenyl acetanilide, and the dyes disclosed in JP-A-62-293247 and JP-A-9-17290 can be exemplified.

When these dyes are added to the ink-receptive layer, the proportion is generally preferably from 0.02 to 10 wt %, more preferably from 0.1 to 5 wt %, based on the entire solid content of the ink-receptive layer.

Further, fluorine-based surfactants and silicon-based surfactants which are well known as coating surface improving agents can also be sued. Specifically, surfactants having a perfluoroalkyl group or a dimethylsiloxane group are useful as they can adjust the coating surface.

As the inorganic or organic fine particles which can be used in the present invention, colloidal silica and colloidal aluminum having a particle size of from 10 to 100 nm, inert particles having a larger particle size than the above colloids, rn e.g., silica particles, surface-hydrophobitized silica particles, alumina particles, titanium dioxide particles, other metallic particles, clay and talc can be exemplified. By the addition of these inorganic or organic fine particles to the ink-receptive layer, the adhesive property of the ink-receptive layer with the upper hydrophilic layer can be improved and impression capability in printing can be increased. The proportion of these fine particles is 80 wt % or less, preferably 40 wt % or less, of the total amount of the ink-receptive layer.

Plasticizers are added to the ink-receptive layer according to the present invention for giving flexibility to the film, if necessary. As such plasticizers, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic -acid or methacrylic acid, etc., are used.

Further, color-forming or decoloring compounds are preferably added to the ink-receptive layer according to the present invention for discriminating between an image area and a non-image area after exposure. For example, leuco dyes (Leuco Malachite Green, Leuco Crystal Violet, and lactone body of Crystal Violet, etc.) and PH discoloring dyes (e.g., Ethyl Violet, Victoria Pure Blue BOH, etc.) are used together with a heat-acid generating agent such as diazo compounds and diphenyl iodonium salts. Further, the combination of acid-coloring dyes with acidic binders as disclosed in EP 897134 is also useful. In this case, the bonding of the associated condition forming a dye is cut by heating to from the lactone body and colored state changes to colorless state.

The addition amount of these color-forming or decoloring compounds is 10 wt % or less, preferably 5 wt % or less, based on the entire amount of the ink-receptive layer.

A light-to-heat conversion material for improving heat sensitivity may further be added to the ink-receptive layer according to the present invention. The light-to-heat conversion material may be the above-described infrared-absorbing dyes and pigments, but in this case, lipophilic dyes and pigments are preferably used. Carbon black and lipophilic cyanine dyes are particularly preferably used. Specific examples of lipophilic cyanine dyes are shown below.

(I-35)

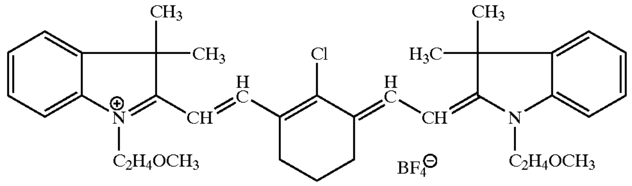

(I-36)

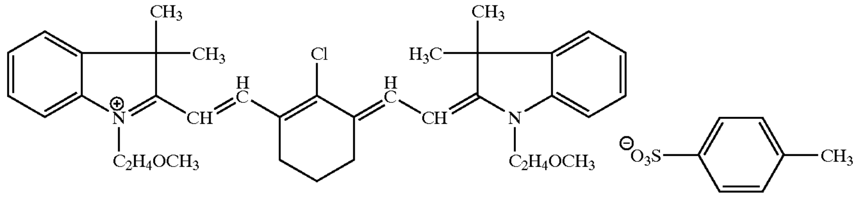

(I-37)

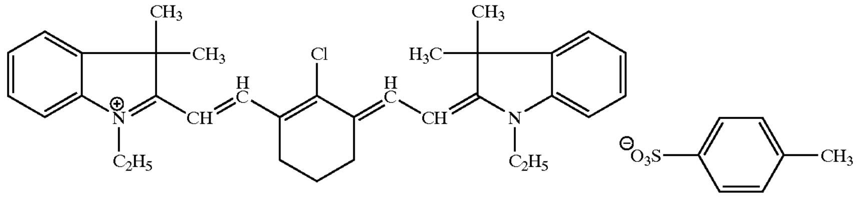

(I-38)

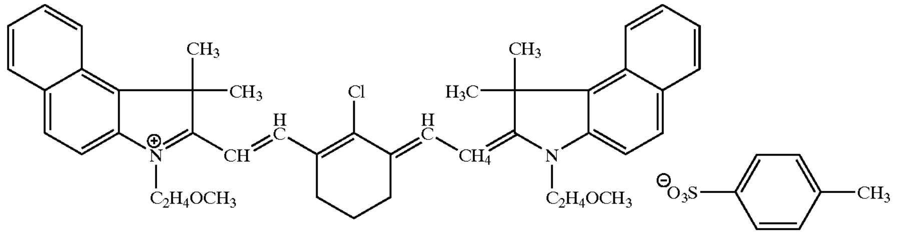

-continued (I-39)

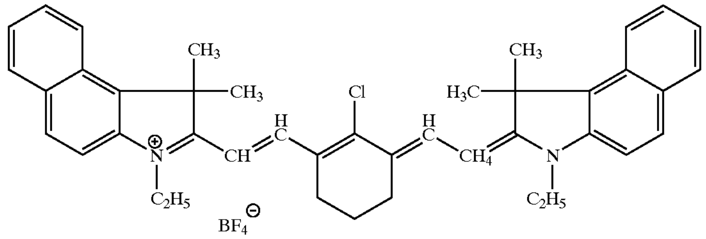

The proportion (of the addition amount) of light-to-heat conversion materials to the ink-receptive layer is preferably 20 wt % or less, more preferably 15 wt % or less, based on the entire amount of the ink-receptive layer. When the addition amount of pigments or dyes exceeds the above range, the durability of the ink-receptive layer is deteriorated.

As the solvent for use in the coating solution of the ink-receptive layer, alcohols (e.g., methanol, ethanol, propyl alcohol, ethylene glycol, diethylene glycol, propylene glycol, dipropylene glycol, ethylene glycol monomethyl ether, propylene glycol monomethyl ether, ethylene glycol monoethyl ether, etc.), ethers (e.g., tetrahydrofuran, ethylene glycol dimethyl ether, propylene glycol dimethyl ether, tetrahydropyran, etc.), ketones (e.g., acetone, methyl ethyl ketone, acetylacetone, etc.), esters (e.g., methyl acetate, ethylene glycol monomethyl monoacetate, etc.), amides (e.g., formamide, N-methylformamide, pyrrolidone, N-methylpyrrolidone, etc.), γ-butyrolactone, methyl lactate, ethyl lactate, etc., can be used. These solvents are used alone or as mixture. When the coating solution is prepared, the concentration of the constitutional component of the ink-receptive layer (the entire solid content exclusive of additives) in a solvent is preferably from 1 to 50 wt %. The film can be formed not only by coating from the organic solvent but also from aqueous emulsion. In this case, the concentration of the component of the ink-receptive layer is preferably from 5 wt % to 50 wt %.

The dry coating thickness of the ink-receptive layer according to the present invention is not particularly limited and the thickness of 0.1 μm or more should be sufficient. When the ink-receptive layer is provided on a metal plate, the thickness of 0.5 μm or more is preferred since the layer also functions as a heat-insulating layer. If the thickness of the ink-receptive layer is too thin, generated heat is dispersed to the metal plate and the sensitivity is lowered. Moreover, if the metal plate is hydrophilic, abrasion resistance is required for the ink-receptive layer, hence impression capability cannot be ensured. When a lipophilic plastic film is used as the substrate, as the ink-receptive layer should be sufficient if it functions as the adhesive layer with the upper layer, the coating amount may be smaller than that in the case of the metal plate, preferably 0.05 μm or more.

An overcoat layer comprising a water-soluble resin may be provided on the hydrophilic layer of the heat-sensitive lithographic printing plate precursor of the present invention for the purpose of inhibiting the scattering of chips (i.e., tailings) due to abrasion and preventing the hydrophilic layer from being stained by lipophilic substances.

The water-soluble overcoat layer for use in the present invention can be easily removed at printing and contains resins selected from water-soluble organic or inorganic high molecular compounds. The water-soluble organic or inorganic high molecular compounds should have film-forming ability by coating and drying. Specific examples of such high molecular compounds include polyvinyl acetate (hydrolysis factor of 65% or more), polyacrylic acid and alkali metal salts or amine salts thereof, polyacrylic acid copolymer and alkali metal salts or amine salts thereof, polymethacrylic acid and alkali metal salts or amine salts thereof, polymethacrylic acid copolymer and alkali metal salts or amine salts thereof, polyacrylamide and copolymers thereof, polyhydroxyethyl acrylate, polyvinyl pyrrolidone and copolymers thereof, polyvinyl methyl ether, polyvinyl methyl ether-maleic anhydride copolymers, poly-2-acrylamide-2-methyl-1-propanesulfonic acid and alkali metal salts or amine salts thereof, poly-2-acrylamide-2-methyl-1-propanesulfonic acid copolymer and alkali metal salts or amine salts thereof, gum arabic, cellulose derivatives (e.g., carboxymethyl cellulose, carboxyethyl cellulose, methyl cellulose, etc.) and modified products thereof, white dextrin, pullulan, and enzyme-decomposing etherified dextrin. These resins may be used as mixture of two or more kinds according to purposes.

In addition, nonionic surfactants can be added to the overcoat layer in the case of coating an aqueous solution for the purpose of ensuring coating uniformity. As such nonionic surfactants, sorbitan tristearate, sorbitan monopalimitate, sorbitan trioleate, stearic acid monoglyceride, polyoxy-ethylenenonylphenyl ether, and polyoxyethylenedodecyl ether can be exemplified.

The proportion of the nonionic surfactants in the entire solid content of the overcoat layer is preferably from 0.05 to 5 wt %, more preferably from 1 to 3 wt %.

A light-to-heat conversion material for improving heat sensitivity may further be added to the overcoat layer according to the present invention. Light-to-heat conversion materials which can be added to the overcoat layer may be the above-described infrared ray-absorbing dyes or pigments, but water-soluble cyanine dyes which are suitable for the hydrophilic layer are preferably used.

The amount of pigments or dyes is from 1 to 70 wt %, preferably from 2 to 50 wt %, of the entire solid content of the overcoat layer, in the case of dyes, the proportion (of the addition amount) is particularly preferably from 2 to 30 wt %, and in the case of pigments, particularly preferably from 20 to 50 wt %. Since a light-to-heat conversion material is added to the hydrophilic layer in the present invention, the addition amount to be added to the overcoat layer according to necessity can be reduced.

The overcoat layer according to the present invention preferably has a thickness of from 0.05 to 4.0 μm, more preferably from 0.1 to 1.0 m. When the overcoat layer is too thick, the removal of the overcoat layer takes longer time, further, a water-soluble resin dissolved in a large amount influences a fountain solution, as a result, bad influences are caused such that roller strip may be generated at printing or ink does not adhere to the image area. Further, when the overcoat layer is too thin, a film property is impaired in some cases.

An image is formed by heating on the lithographic printing plate precursor according to the present invention. Specifically, an image is recorded by direct image-drawing with a heat-recording head, scanning exposure with an infrared laser, high intensity flash exposure by a xenon discharge lamp, etc., and infrared lamp exposure. Exposure by solid state high output infrared lasers such as semiconductor lasers emitting infrared rays of wavelength of from 700 to 12,000 nm and YAG lasers is preferred in the present invention.

Image-exposed lithographic printing plate precursor according to the present invention can be loaded on a printer (i.e., a printing press) without necessitating any further process. With entering into printing using ink and a fountain solution, the overcoat layer is removed by the fountain solution and at the same time the hydrophilic layer at the exposed area is also removed, ink adheres to the ink-receptive layer under the hydrophilic layer and printing begins.

The present invention is specifically described below with referring to examples, but it should not be construed as the present invention is limited thereto.

EXAMPLE 1

Synthesis of Organic High Polymer for Ink-Receptive Layer

Four point six one (4.61) grams (0.0192 mol) of N-(p-aminosulfonylphenyl)methacrylamide, 2.94 g (0.0258 mol) of ethyl methacrylate, 0.80 g (0.015 mol) of acrylonitrile and 20 g of N,N-dimethylacetamide were added to a three necked flask having a capacity of 200 ml equipped with a stirrer, a cooling pipe and a dropping funnel, and the mixture was stirred with heating at 65° C. in a hot water bath. To the mixture was added 0.15 g of V-65 (a product of Wako Pure Chemical Co., Ltd.) and the reaction mixture was stirred under nitrogen flow for 2 hours with maintaining the temperature at 65° C. To the reaction mixture was further dropwise added a mixture comprising 4.61 g of N-(p-aminosulfonylphenyl)methacrylamide, 2.94 g of ethyl methacrylate, 0.80 g of acrylonitrile, N,N-dimethylacetamide and 0.15 g of polymerization initiator V-65 (a product of Wako Pure Chemical Co., Ltd.) by means of a dropping funnel over 2 hours. After termination of the dropwise addition, the reaction mixture was further stirred at 65° C. for 2 hours. After completion of the reaction, 40 g of methanol was added thereto and cooled. The mixture obtained was poured into 2 liters of water with stirring and then stirring was continued for 30 minutes, and then recovered by filtration and dried, thereby 15 g of white solid was obtained. This N-(p-amino-sulfonylphenyl)methacrylamide copolymer was found to have a weight average molecular weight (polystyrene standard) of 53,000 by gel permeation chromatography.

Preparation of Ink-Receptive Substrate

On an aluminum plate (quality of material: JIS A1050, thickness: 0.24 mm) having been subjected to well-known graining, anodic oxidation treatment and sodium silicate solution treatment was coated a coating solution comprising 3 g of the above N-(p-aminosulfonylphenyl)methacrylamide copolymer, 9.5 g of γ-butyrolactone, 3 g of methyl lactate, 22.5 g of methyl ethyl ketone, and 22 g of propylene glycol monomethyl ether. The coating solution was coated by a bar coater so that the coating amount of the solution became 24 ml/m$^2$. Thereafter, the aluminum plate was dried by heating at 100° C. for 1 minute, thereby an aluminum substrate with an ink-receptive layer having a dry coating weight of about 1 g/m$^2$ was obtained.

Preparation of Heat-Sensitive Lithographic Printing Plate Precursor

A coating solution comprising 1 g of a 10% ethylene glycol monomethyl ether solution of poly-2-hydroxyethyl methacrylate (weight average molecular weight: 250,000), 3 g of methanol silica (manufactured by Nissan Chemical Industries, Ltd., colloid comprising a methanol solution containing 30 wt % of silica particles having a particle diameter of from 10 to 20 nm), 0.08 g of Cyanine Dye (I-33), and 16 g of methanol was coated on the above-coated ink-receptive layer provided on the aluminum substrate, and dried at 100° C. for 1 minute to thereby provide a hydrophilic layer having a dry coating weight of about 1 g/m$^2$ on the ink-receptive layer.

Preparation of Lithographic Printing Plate and Printing

The above lithographic printing plate precursor was attached to 40 W Trend Setter (a plate setter loading a semiconductor laser of 830 nm, 40 W, manufactured by CREO Co., Canada) and exposure was performed by energy of 300 mJ/cm$^2$. The exposed printing plate precursor was loaded on Harris printer without any further process. When printing was performed using ink and a fountain solution comprising a 10 vol % aqueous isopropyl alcohol solution containing an etching solution, 10,000 sheets of clear printed matters could be obtained.

EXAMPLE 2

A heat-sensitive lithographic printing plate precursor was prepared in the same manner as in Example 1 except that 4.5 g of Graska 401 (manufactured by Nippan Kenkyu-Jo Co., Ltd., a 20 wt % methanol colloidal solution comprising $ZrO_2.SiO_2$) was used in place of 3 g of methanol silica. The printing plate precursor was subjected to exposure in the same manner as in Example 1. When printing was performed with Harris printer, 10,000 sheets of clear printed matters could be obtained.

EXAMPLE 3

A heat-sensitive lithographic printing plate precursor was prepared in the same manner as in Example 1 except that 1 g of a 10% ethylene glycol monomethyl ether solution of a copolymer (weight average molecular weight: 200,000) of 2-hydroxyethyl methacrylate/methyl methacrylate (70/30 wt %) was used in place of 1 g of a 10% ethylene glycol monomethyl ether solution of 2-hydroxyethyl methacrylate homopolymer. The printing plate precursor was subjected to exposure in the same manner as in Example 1. When printing was performed with Harris printer, 15,000 sheets of clear printed matters could be obtained.

EXAMPLE 4

A heat-sensitive lithographic printing plate precursor was prepared in the same manner as in Example 1 except that 2 g of a 10% ethylene glycol monomethyl ether solution of a copolymer (weight average molecular weight: 300,000) of 2-hydroxyethyl methacrylate/acrylic acid (90/10 wt %) was used in place of 1 g of a 10% ethylene glycol monomethyl ether solution of 2-hydroxyethyl methacrylate homopolymer. The printing plate precursor was subjected to exposure in the same manner as in Example 1. When printing was performed with Harris printer, 20,000 sheets of clear printed matters could be obtained.

EXAMPLE 5

A heat-sensitive lithographic printing plate precursor was prepared by coating a hydrophilic layer having the following composition on the substrate having the ink-receptive layer in Example 1.

| Prescription of Hydrophilic Layer | |
|---|---|
| Methanol silica (the same as in Example 1) | 4.5 g |
| A 10% ethylene glycol monomethyl ether solution of poly-2-hydroxyethyl methacrylate (the same as in Exampie 1) | 1.5 g |
| Cyanine Dye (I-34) | 0.10 g |
| Methanol | 16 g |

The dry coating weight of the hydrophilic layer of this printing plate precursor was 1.5 g/m$^2$. The printing plate precursor was attached to the same plate setter used in Example 1 and exposure was performed by energy of 450 mJ/cm$^2$. The exposed printing plate precursor was loaded on Harris printer. When printing was performed using ink and a fountain solution comprising a 10 vol % aqueous isopropyl alcohol solution containing an etching solution, 25,000 sheets of clear printed matters could be obtained.

EXAMPLE 6

An overcoat layer having the following composition was coated on the heat-sensitive lithographic printing plate precursor in Example 1, and the coated layer was dried at 100° C. for 2 minutes, thereby a heat-sensitive lithographic printing plate precursor with an overcoat layer having a dry coating weight of 0.6 g/m$^2$ on the hydrophilic layer was prepared.

| Prescription of Overcoat Layer | |
|---|---|
| Polyacrylic acid (weight average molecular weight: 25,000) | 1.0 g |
| Polyoxyethylenenonylphenyl ether | 0.025 g |
| Water | 19 g |

The printing plate precursor was subjected to exposure in the same manner as in Example 1. According to the observation of the exposed printing plate precursor, the hydrophilic layer is hardly scattered due to abrasion, and it was found that scattering was prevented. When printing was performed with Harris printer in the same manner as in Example 1, 10,000 sheets of clear printed matters could be obtained. On the area where fingers touched when the printing plate precursor was attached to the printer, staining of fingerprints were not generated.

EXAMPLES 7 TO 11

In place of N-(p-aminosulfonylphenyl)methacrylamide copolymer in Example 1, a phenoxy resin (trade name: Phenototo YP-50, manufactured by Toto Kasei Co., Ltd.) was used in Example in 7, a polyvinyl formal resin (trade name: Denka Formal #200, manufactured by Electro Chemical Industry Co., Ltd.) was used in Example 8, a polyurethane resin (trade name: Estan #5715, manufactured by Monsanto Co., Ltd.) was used in Example 9, a saturated copolymer polyester resin (trade name: Kemit K-1294, manufactured by Toray Industries Inc., was used in Example 10, and methyl methacrylate/methacryloyloxypropyltriethoxysilane (60/40 wt %) copolymer (average molecular weight: 85,000) was used in Example 11. Three point zero (3.0) grams of each resin was dissolved in a mixed solvent comprising 37 g of methyl ethyl ketone and 20 g of propylene glycol monomethyl ether, further 0.04 g of Megafac F-177 (a fluorine-based surfactant manufactured by Dainippon Chemicals and Ink Co., Ltd.) was added to each coating solution, and the coating solution was coated by a bar coater so that the coating amount of the solution became 24 ml/m$^2$. Thereafter, the aluminum plate was dried by heating at 100° C. for 1 minute, thereby an aluminum substrate with an ink-receptive layer having a dry coating weight of about 1 g/m$^2$ was obtained. The same hydrophilic layer as in Example 1 was coated on each substrate, and the same overcoat layer as in Example 6 was coated on the hydrophilic layer to thereby obtain a heat-sensitive lithographic printing plate precursor. Each printing plate precursor was subjected to exposure in the same manner as in Example 1. When printing was performed with Harris printer, 10,000 sheets of clear printed matters could be obtained.

EXAMPLES 12 TO 14

Substrates having an ink-receptive layer containing a light-to-heat conversion material were prepared by replacing the coating solution for the ink-receptive layer in Example 1 with the following composition.

| Prescription of Coating Solution for Ink-Receptive Layer | |
|---|---|
| N-(p-aminosulfonylphenyl)methacrylamide copolymer in Example 1 (the same as in Example 1) | 3 g |
| Cyanine dye | 0.3 g |
| γ-Butyrolactone | 9.5 g |
| Methyl lactate | 3 g |
| Methyl ethyl ketone | 22.5 g |
| Propylene glycol monomethyl ether | 22 g |

Cyanine Dye (I-36) was used in Example 12, Cyanine Dye (I-37) was used in Example 13 and Cyanine Dye (I-38) was used in Example 14, respectively.

The same hydrophilic layer as in Example 5 was coated on the above-prepared substrate having the ink-receptive layer in a dry coating weight of about 1.5 g/m$^2$, and the same overcoat layer as in Example 6 was coated on the hydrophilic layer, thereby a heat-sensitive lithographic printing plate precursor was obtained. Each printing plate precursor was attached to the same plate setter used in Example 1 and exposure was performed by energy of 400 mJ/cm$^2$. When the exposed printing plate precursor was loaded on Harris printer and printing was performed, 25,000 sheets of clear printed matters could be obtained.

EXAMPLE 15

An overcoat layer having the following composition was coated on the heat-sensitive lithographic printing plate precursor in Example 5 in a dry coating weight of 0.6 g/m$^2$, thereby a heat-sensitive lithographic printing plate precursor was prepared.

| Prescription of Overcoat Layer | |
|---|---|
| Polyacrylic acid (weight average molecular weight: 25,000) | 1.0 g |
| Polyoxyethylenenonylphenyl ether | 0.025 g |

-continued

| Prescription of Overcoat Layer | |
|---|---|
| Cyanine Dye (I-31) | 0.2 g |
| Water | 19 g |

The printing plate precursor was attached to the same plate setter used in Example 1 and exposure was performed by energy of 400 mJ/cm$^2$. When the exposed printing plate precursor was loaded on Harris printer and printing was performed, 25,000 sheets of clear printed matters could be obtained.

EXAMPLE 16

A heat-sensitive lithographic printing plate precursor was prepared in the same manner as in Example 1 except that a polyethylene terephthalate film having a thickness of 0.2 mm was used in place of the aluminum plate in Example 1. The printing plate precursor was subjected to exposure in the same manner as in Example 1. When exposed printing plate precursor was loaded on Harris printer and printing was performed, 10,000 sheets of clear printed matters could be obtained.

EXAMPLE 17

A hydrophilic layer having the following composition was coated on the substrate having provided thereon the ink-receptive layer used in Example 1, and the coated layer was dried at 100° C. for 1 minute, thereby a three dimensionally crosslinked hydrophilic layer having a dry coating weight of 1 g/m$^2$ was obtained.

| Prescription of Coating Solution for Hydrophilic Layer | |
|---|---|
| A 10 wt % ethylene glycol monomethyl ether solution of poly-2-hydroxyethyl methacrylate (the same as in Example 1) | 1 g |
| A 30% aqueous methanol solution of methanol silica (the same as in Example 1) | 3 g |
| Aminopropyltriethoxysilane | 0.05 g |
| Cyanine Dye (I-34) | 0.13 g |
| Methanol | 16 g |

A heat-sensitive lithographic printing plate precursor having the same overcoat layer as in Example 6 on the hydrophilic layer was prepared. The printing plate precursor was exposed in the same manner as in Example 1. When the exposed printing plate precursor was loaded on Harris Printer and printing was performed, 20,000 sheets of clear printed matters could be obtained.

EXAMPLE 18

The coating solution for an ink-receptive layer having the following composition was coated on the same aluminum plate as in Example 1 in a coating amount of 20 ml/m$^2$, and the coated layer was dried at 100° C. for 1 minute, thereby an aluminum substrate with an ink-receptive layer having a dry coating weight of about 0.6 g/m$^2$ was obtained.

| Prescription of Coating Solution for Ink-Receptive Layer | |
|---|---|
| N-(p-aminosulfonylphenyl)methacrylamide/ methyl methacrylate/acrylonitrile/ 2-hydroxyethyl methacrylate copolymer (40/10/30/20 wt %) | 3 g |
| Ethylene glycol monomethyl ether | 50 g |
| Methyl ethyl ketone | 47 g |

The coating solution for a hydrophilic layer as described below was coated on the ink-receptive layer with a bar coater, and the coated layer was dried at 100° C. for 5 minutes, thereby a hydrophilic layer having a dry coating weight of about 2 g/m$^2$ was obtained.

Preparation of Coating Solution for Hydrophilic Layer

Eighteen (18) grams of tetraethoxysilane, 32 g of ethanol, 32 g of pure water and 0.02 g of nitric acid were put in a beaker and stirred at room temperature for 1 hour to prepare a sol solution. Three (3) grams of the sol solution, 4 g of a 10% aqueous solution of polyvinyl alcohol (trade name: PVA117, manufactured by Kuraray Co., Ltd.), 8 g of a 20% aqueous solution of colloidal silica (trade name: Snowtex C, manufactured by Nissan Chemical Industries, Ltd.), 0.10 g of Cyanine Dye (I-33), 8 g of pure water, and 0.04 g of polyoxyethylenenonylphenyl ether were mixed. The same overcoat layer as in Example 6 was then coated on the hydrophilic layer, thereby a heat-sensitive lithographic printing plate precursor was obtained. This printing plate precursor was attached to 40 W Trend Setter (a plate setter loading a semiconductor laser of 830 nm, 40 W, manufactured by CREO Co., Canada) and exposure was performed by irradiating energy of 600 mJ/cm$^2$, and the exposed printing plate precursor was loaded on Harris printer. As a result of printing, 40,000 sheets of clear printed matters could be obtained.

EXAMPLES 19 TO 22

Each of the following hydrophilic resin was used in place of 4 g of a 10% aqueous polyvinyl alcohol solution in Example 18.

Example 19: 4 g of a 10% aqueous solution of ethylene glycol monomethyl ether of a 2-hydroxyethyl methacrylate/acrylic acid (70/30 wt %) copolymer (weight average molecular weight: 250,000)

Example 20: 4 g of a 10% aqueous solution of poly-2-hydroxyethyl acrylate (weight average molecular weight: 200,000)

Example 21: 4 g of a 10% aqueous solution of polyacrylic acid (weight average molecular weight: 100,000)

Example 22: 4 g of a 10% aqueous solution of a 2-hydroxyethyl methacrylate/2-acrylamide-2-methyl-1-propanesulfonic acid (80/20 wt %) copolymer (weight average molecular weight: 100,000)

Since the gelation of the coating solution in Example 22 progresses rapidly, coating was immediately completed after mixing the copolymer. Except for that point, each heat-sensitive lithographic printing plate precursor having an overcoat layer was prepared in the same manner as in Example 18, and the printing plate precursor was subjected to exposure. As a result of printing, 40,000 sheets of clear printed matters could be obtained with every printing plate precursor.

EFFECT OF THE INVENTION

The present invention can solve the drawbacks of the heat mode plate-making method according to conventional laser exposure. That is, the lithographic printing plate precursor according to the present invention can be loaded on a printer (i.e., a printing press) without necessitating any process after exposure and then printing can be performed as it is. A heat-sensitive lithographic printing plate precursor which is excellent in press life and is hard to generate printing staining can be obtained according to the present invention.

While the invention has been described in detail and with reference to specific examples thereof, it will be apparent to one skilled in the art that various changes and modifications can be made therein without departing from the spirit and scope thereof.

What is claimed is:

1. A heat-sensitive lithographic printing plate precursor comprising a substrate having an ink-receptive surface or coated with an ink-receptive layer containing a light-to-heat conversion material, having provided thereon a hydrophilic layer which comprises:

(1) a colloid of an oxide or a hydroxide of at least one element selected from the group consisting of beryllium, magnesium, aluminum, silicon, titanium, boron, germanium, tin, zirconium, iron, vanadium, antimony, and transition metals, (2) a hydrophilic resin, and (3) a light-to-heat conversion material and a hydrophilic overcoat layer capable of being removed on a printing machine, in this order wherein the hydrophilic overcoat layer contains a light-to-heat conversion material.

2. A heat-sensitive lithographic printing plate precursor comprising a substrate having an ink-receptive surface or coated with an ink-receptive layer having provided thereon a hydrophilic layer which comprises:

(1) a colloid of an oxide or a hydroxide of at least one element selected from the group consisting of beryllium, magnesium, aluminum, silicon, titanium, boron, germanium, tin, zirconium, iron, vanadium, antimony, and transition metals;

(2) a hydrophilic resin; and (3) a light-to-heat conversion material, and a hydrophilic overcoat layer capable of being removed on a printing machine, in this order wherein the hydrophilic overcoat layer contains a light-to-heat conversion material.

3. A heat-sensitive lithographic printing plate precursor comprising a substrate subjected to a surface roughing treatment and coated with an ink-receptive layer having provided thereon a hydrophilic layer which comprises:

(1) a colloid of an oxide or a hydroxide of at least one element selected from the group consisting of beryllium, magnesium, aluminum, silicon, titanium, boron, germanium, tin, zirconium, iron, vanadium, antimony, and transition metals;

(2) a hydrophilic resin;

(3) a light-to-heat conversion material, and a hydrophilic overcoat layer capable of being removed on a printing machine, in this order wherein the hydrophilic overcoat layer contains a light-to-heat conversion material.

4. The heat-sensitive lithographic printing plate precursor as claimed in claim 3, wherein the ink-receptive layer contains a light-to-heat conversion material.

5. The heat-sensitive lithographic printing plate precursor as claimed in any one of claims 1, 2, and 3, wherein the hydrophilic layer comprises:

(1) as a main component, the colloid of an oxide or a hydroxide of at least one element selected from the group consisting of beryllium, magnesium, aluminum, silicon, titanium, boron, germanium, tin, zirconium, iron, vanadium, antimony, and transition metals;

(2) the hydrophilic resin in an amount of 5 to 20 wt %; and (3) the light-to-heat conversion material in an amount of 2 to 20 wt %.

6. A heat-sensitive lithographic printing plate precursor comprising a substrate having an ink-receptive surface or coated with an ink-receptive layer having provided thereon a hydrophilic layer which comprises:

(1) as a main component, a colloid of an oxide or a hydroxide of at least one element selected from the group consisting of beryllium, magnesium, aluminum, silicon, titanium, boron, germanium, tin, zirconium, iron, vanadium, antimony, and transition metals wherein the colloid is present in an amount of 63.3 to 93.0 wt % based on the total solid content of the hydrophilic layer;

(2) a hydrophilic resin in an amount of 5 to 20 wt %; and (3) a light-to-heat conversion material in an amount of 2 to 20 wt %.

7. The heat-sensitive lithographic printing plate precursor as claimed in any one of claims 1, 2, and 6, wherein the substrate is subjected to a surface roughing treatment.

8. The heat-sensitive lithographic printing plate precursor as claimed in claim 6, which further comprises, on the hydrophilic layer, a hydrophilic overcoat layer capable of being removed on a printing machine.

9. The heat-sensitive lithographic printing plate precursor as claimed in claim 8, wherein the hydrophilic overcoat layer contains a light-to-heat conversion material.

* * * * *